(12) United States Patent
Furukawa

(10) Patent No.: US 6,833,708 B2
(45) Date of Patent: Dec. 21, 2004

(54) LEAK DETECTING CIRCUIT FOR POWER SOURCE DEVICE

(75) Inventor: Kimihiko Furukawa, Hirakata (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 10/296,759

(22) PCT Filed: Mar. 13, 2002

(86) PCT No.: PCT/JP02/02385
§ 371 (c)(1),
(2), (4) Date: Nov. 27, 2002

(87) PCT Pub. No.: WO02/082107
PCT Pub. Date: Oct. 17, 2002

(65) Prior Publication Data
US 2003/0137319 A1 Jul. 24, 2003

(30) Foreign Application Priority Data
Mar. 30, 2001 (JP) .......................... 2001-99719

(51) Int. Cl.[7] .................. G01N 27/416; G01R 31/00
(52) U.S. Cl. .................. 324/426; 324/503; 324/511
(58) Field of Search ................... 324/426, 433, 324/434, 522, 537, 503, 511; 361/42–50; 320/116

(56) References Cited

U.S. PATENT DOCUMENTS 3,875,499 A * 4/1975 Roberts ................. 324/468
5,481,194 A * 1/1996 Schantz et al. ........... 324/522
5,760,587 A * 6/1998 Harvey ................ 324/434

FOREIGN PATENT DOCUMENTS

JP          6-153303        5/1994

OTHER PUBLICATIONS

Copy of Japanese Patent Office Action for corresponding Japanese Patent Application No. 2001–099719 dated May 11, 2004.

* cited by examiner

Primary Examiner—N. Le
Assistant Examiner—Vincent Q. Nguyen
(74) Attorney, Agent, or Firm—Armstrong, Kratz, Quintos, Hanson & Brooks, LLP

(57) ABSTRACT

In a power source device having a cell unit, a leak detecting circuit in which a line P and a line N extending from the cell are connected to each other by two P-side voltage dividing resistors and two N-side voltage dividing resistors, and the midpoint between the P-side resistors and N-side resistors is grounded. The line P and the line N are also connected to each other by first to third auxiliary voltage dividing resistors. The midpoint between the first and second auxiliary resistors and the midpoint between the P-side first and second resistors are connected to each other by a P-side voltage comparison circuit. The midpoint between the second and third auxiliary resistors and the midpoint between the N-side first and second resistors are connected to each other by an N-side voltage comparison circuit.

5 Claims, 5 Drawing Sheets

LEAK DETECTING CIRCUIT FOR POWER SOURCE DEVICE

BACKGROUND OF THE INVENTION

1. Field of the Invention

The present invention relates to leak detecting circuits for power source devices for use in electric motor vehicles and the like, and more particularly to a leak detecting circuit for a power source device having a cell unit comprising a plurality of cells.

2. Description of the Related Art

Electric motor vehicles such as hybrid cars are provided with a cell unit serving as a power source for the drive motor and comprising a plurality of secondary cells connected in series. Such a cell unit produces a high voltage, for example, of at least 240 V, so that if a leak occurs, a leakage current flowing portion is likely to provide an electric shock to the person by contact, posing the problem of bringing a danger to the human body. Accordingly, it is conventional practice to provide a circuit for detecting leaks, as shown in FIG. 5, to notify a control system or the driver of the occurrence of a leak upon detecting the fault. The leak detecting circuit of FIG. 5 has a cell unit Vb which comprises about 200 nickel-hydrogen cells NiMH connected in series, and an output voltage, which is usually about 240 V, is available across a positive (P) terminal and a negative (N) terminal. Voltage dividing resistors R1 and R2 (R1=R2) of high resistance value are connected between the P and N terminals, and the midpoint between the two resistors is grounded via a resistor R3. The voltage between the opposite ends of the resistor R3 is detected by a voltmeter V. In the case of electric motor vehicles, "grounding" means connection to the chassis (vehicle body).

When no leak occurs, no current flows through the resistor R3, with the result that the voltmeter V delivers zero output. If a leak occurs in the line P, the line P is grounded via a ground-fault resistance RL in the resulting equivalent circuit as indicated in a broken line in the diagram. Formed in the equivalent circuit is a current path of line P→ resistance RL→ resistor R3→ resistor R2→ line N, and a voltage is produced between the opposite ends of the resistor R3. The leak can be detected by detecting the voltage thus produced by the voltmeter V. The voltmeter V has the function of measuring the voltage in detecting the leak and judging whether the measurement is not lower than a predetermined value or below the predetermined value, and can therefore be provided by a voltage comparator.

In FIG. 5, the resistors R1, R2, R3 provide insulation resistance for the cell unit against ground, and the combined resistance value of these resistors is substantially an insulation resistance value. Usually the circuit is so desired that the combined resistance value will not be less than 1 MΩ. Assuming that the input impedance of the voltmeter V is Zv, the insulation resistance value Rz in FIG. 5 is calculated from Mathematical Expression 1.

$$Rz = R1 \cdot R2/(R1+R2) + R3 \cdot Zv/(R3+Zv) \quad \text{(Mathematical Expression 1)}$$

When the resistance values of the resistors R1, R2 are small, the cell voltage Vb remains applied to the resistors R1 and R2 to discharge the cell unit at all times, so that the resistors R1, R2 have a relatively high resistance value. For example, in the case where the cell voltage is 240 V and the limit value for the allowable discharge current is 100 μA, the combined resistance value of the resistors R1, R2 is at least 2.4 MΩ. Accordingly, the resistors R1, R2 have a high resistance value with reference to this resistance value. As a result, the insulation resistance value Rz of Mathematical Expression 1 is such that the first term becomes predominant which makes it possible to provide a sufficiently great value to the insulation resistance value Rz even if the resistance R3 and impedance Zv of the second term have relatively small values. Usually, the resistor R3 is designed to have a small resistance value so that the input impedance Zv of the voltmeter V is negligible.

FIG. 6 shows the construction of another conventional leak detecting circuit. The circuit has voltage dividing resistors R1 and R2 of high resistance value connected between P and N terminals. The midpoint between the two resistors is grounded. The potential difference between the line P and the grounded point is detected by a voltmeter V1, and the potential difference between the line N and the grounded point by a voltmeter V2. To afford a sufficiently great insulation resistance, the resistors R1, R2 have a high resistance value, for example, of at least 2.2 MΩ.

In the leak detecting circuit of FIG. 6, a high voltage of Mathematical Expression 2 below is steadily applied to the voltmeters V1, V2 even in the event of no leak occurring.

$$V1 = V2 = (1/2)Vb \quad \text{(Mathematical Expression 2)}$$

If a leak occurs in the line P, the line P is grounded via a ground-fault resistance RL in the resulting equivalent circuit as indicated in a broken line in the diagram. Accordingly, the leak is detectable from a decrease in the voltage detected by the voltmeter V1 or an increase in the voltage detected by the voltmeter V2.

Power source devices comprising a cell unit include those which require detection of the "degree" of leaks. In the event of a leak occurring, for example, there arises a need to judge whether a countermeasure should be taken urgently or in due time in accordance with the "degree" of the leak. Stated more specifically, a judgement is made in accordance with the magnitude range of ground-fault resistance RL as shown in FIG. 7. The value of ground-fault resistance RL, when not smaller than a threshold value RL2, indicates occurrence of no leak, hence safety. If the value RL is within the range of a threshold value RL1 to the value RL2, this indicates the occurrence of a leak, which nevertheless is not dangerous to the human body. When up to the threshold value RL1, the value RL is interpreted as indicating a danger to the human body. For example, if resistance values dangerous to the human body are up to about 100 Ω/V (at least 10 mA calculated as current), the threshold value RL1 is 24 kΩ when the output voltage is 240 V. However, if the threshold values RL1, RL2 are great, an increased impedance will result, causing the circuit to make an error in detection, so that the threshold values RL1, RL2 are determined in the range of 50 to 70 kΩ, with an allowance made for the value 24 kΩ.

FIG. 8 shows the leak detecting circuit of FIG. 5 when R1=R2=2.2 MΩ, R3=10 kΩ (Zv is sufficiently great relative to R3), and Vb=240 V. In the case where the ground-fault resistance RL has varying values of 0 Ω, 50 kΩ, 70 kΩ, 1 MΩ, 2 MΩ and ∞, the voltage values to be detected by the voltmeter V are listed in Table 1.

TABLE 1

| Ground-fault resistance RL | 0 Ω | 50 kΩ | 70 kΩ | 1 MΩ | 2 MΩ | ∞ |
|---|---|---|---|---|---|---|
| Voltage to be detected V | 1.081 V | 1.034 V | 1.017 V | 0.569 V | 0.386 V | 0 V |

With reference to FIG. 8, two voltmeters VA, VB connected in parallel with the resistor R3 are for use in detecting leaks when the ground-fault resistance is up to 70 kΩ and up to 50 kΩ, respectively. The voltmeter VA is adapted to detect leaks at not lower than 1.017 V, and the voltmeter VB operates for detection at not lower than 1.034 V as will be described below more specifically.
(1) Neither of the voltmeters VA, VB operate for detection at not higher than 1.017 V. This case is interpreted as indicating occurrence of no leak.
(2) The voltmeter VA operates for detection when the voltage to be detected is in the range of 1.017 to 1.034. The voltage is interpreted as indicating the occurrence of a leak in the precaution range shown in FIG. 7.
(3) Both the voltmeters VA, VB operate for detection when the voltage to be detected is at least 1.034 V. The voltage is interpreted as indicating the occurrence of a leak in the dangerous range shown in FIG. 7.

In the case where a leak occurs in the line N, the sign of the calculated values in Table 1 is reversed, so that the voltage detecting circuit is constructed so as to detect positive voltages as well as negative voltages, and the sign is taken into consideration in making a judgement according to the above criteria (1) to (3).

Table 1 shows that as the ground-fault resistance RL decreases from infinity (no leak), the voltage to be detected increases. While the maximum variation in the voltage to be detected is 1.081 V, the difference between 50 kΩ and 70 kΩ in detected voltage is as small as 17 mV (1.6% of the maximum variation 1.081 V). Accordingly, there is a need to use voltmeters of very high precision for accurate judgement.

With the leak detecting circuit of FIG. 6, the precision required of the voltmeters can be lower. FIG. 9 shows a specific design example, and Table 2 shows variations in the voltage to be detected at varying ground-fault resistance values.

TABLE 2

| Ground-fault resistance RL | 0 Ω | 50 kΩ | 70 kΩ | 1 MΩ | 2 MΩ | ∞ |
|---|---|---|---|---|---|---|
| Voltage to be detected V1 | 0 V | 5.217 V | 7.179 V | 57.143 V | 77.419 V | 120 V |
| Voltage to be detected V2 | 240 V | 234.8 V | 232.8 V | 182.9 V | 162.6 V | 120 V |

As shown in Table 2, the difference between the ground-fault resistances 50 kΩ and 70 kΩ in the voltage to be detected is increased to 1.962 V. In the event of no leak occurring, 120 V is applied to the voltmeters, and the accuracy achieved at this voltage is about 1.6%. With the leak detecting circuit of FIG. 6, however, it is difficult to maintain a high insulation resistance because the cell unit is grounded via the voltmeters. Further the circuit involves the problem that a high voltage is applied to the pair of voltmeters in the event of a leak occurring.

The leak detecting circuit of FIG. 6 is modified into the circuit of FIG. 10 which is adapted to detect leaks individually when the ground-fault resistance is 50 kΩ and 70 kΩ. With reference to FIG. 10, voltmeters V1A, V2A are adapted to detect leaks due to a ground-fault resistance of 70 kΩ, and voltmeters V1B, V2B are for use in detecting leaks due to a ground-fault resistance of 50 kΩ.

Any of the circuits shown in FIGS. 8, 9 and 10 detects the occurrence of leaks in terms of the absolute values of voltage levels, so that the leak voltage value is obtained merely as a "value at a particular cell voltage." However, the actual cell voltage varies over a wide range, for example, from 280 V at the fully charged state to 120 V at the final stage of discharge. The calculated values in Table 1 or 2 also vary with these variations in cell voltage, such that even at a particular leak resistance value, the voltage can be detected as indicating a leak or will not be detected as indicating a leak, depending on the charged state. More specifically, the voltage to be detected increases with an increase in cell voltage, so that a problem is encountered in that a leak will be detected even if the leak resistance value is so great that there is essentially no need to detect any leak.

An object of the present invention is to provide a leak detecting circuit for use in power source devices which is capable of accurately detecting a leak which occurs due to a relatively low ground-fault resistance, for example, of tens of kΩ. Another object of the invention is to provide a leak detecting circuit which is adapted to detect a leak due to a predetermined ground-fault resistance by detecting a specified voltage even when the output voltage of the power source device varies.

SUMMARY OF THE INVENTION

For use in power source devices, the present invention provides a leak detecting circuit wherein a pair of positive and negative power lines extending from respective opposite electrodes of a cell unit are connected to each other by four voltage dividing resistors R1A, R1B, R2A, R2B connected to one another in series, and a midpoint between the two voltage dividing resistors R1A, R1B arranged on the positive power line side and the two voltage dividing resistors R2A, R2B arranged on the negative power line side is grounded. The potential difference between the positive power line and the midpoint between the two voltage dividing resistors R1B, R1B on the positive side and the potential difference between the negative power line and the midpoint between the two voltage dividing resistors R2A, R2B on the negative side are compared with respective reference voltages to detect a leak.

The reference voltage on the positive side is set at a potential difference to be produced between the positive power line and the midpoint between the two voltage dividing resistors R1A, R1B on the positive side when a leak occurs due to a ground-fault resistance value to be detected, and the reference voltage on the negative side is set at a potential difference to be produced between the negative power line and the midpoint between the two voltage dividing resistors R2A, R2B on the negative side when a leak occurs due to a ground-fault resistance value to be detected.

In the leak detecting circuit of the invention described, the voltage obtained between opposite electrodes of the cell unit is divided by the four voltage dividing resistors R1A, R1B, R2A, R2B. The voltages consequently produced across opposite ends of the respective resistors R1A, R2A which are positioned at the respective ends are compared with respective reference voltages. In the absence of a leak, the voltage is greater than the reference voltage, indicating that no leak is occurring.

On the other hand, suppose a leak occurs, for example, in the positive power line. An equivalent circuit is then formed wherein the positive power line and the midpoint of the four voltage dividing resistors are connected to each other via a ground-fault resistance. As a result, the potential at the midpoint between the two voltage dividing resistors R1A and R1B on the positive side increases, consequently lowering the voltage across the resistor R1A to below the reference voltage. This indicates the occurrence of the leak. If a leak occurs in the negative power line, the voltage across the resistor R2A similarly decreases to below the reference voltage, indicating the occurrence of the leak.

Specifically stated, the pair of positive and negative power lines extending from the respective opposite electrodes of the cell unit are connected to each other by at least three auxiliary voltage dividing resistors R3, R4, R5 connected to one another in series, and a plurality of potential reference points are provided between the auxiliary voltage dividing resistors. A positive-side voltage comparison circuit V1 is interposed between one of the potential reference points and the midpoint between the two voltage dividing resistors R1A, R1B on the positive side, and a negative-side voltage comparison circuit V2 is interposed between the another one of the potential reference points and the midpoint between the two voltage dividing resistors R2A, R2B on the negative side.

In this specific arrangement, the voltage produced at the potential reference points between the three auxiliary voltage dividing resistors R3, R4, R5 varies in proportion to the variations in the voltage output from the cell unit. Using the voltage as the reference voltage for the detection of leaks, the positive-side voltage comparison circuit V1 compares the voltage of the midpoint between the positive-side two resistors R1A, R1B with the reference voltage, and the negative-side voltage comparison circuit V2 compares the voltage of the midpoint between the negative-side two resistors R2A, R2B with the reference voltage. This ensures the detection of leak free of the influence of variations in the output voltage of the cell unit.

Further stated specifically, a positive-side voltage limiter is interposed between the positive power line and a positive terminal of the positive-side voltage comparison circuit V1 for limiting the potential difference between opposite ends of the voltage limiter to not higher than a predetermined value, and a negative-side voltage limiter is interposed between the negative power line and a negative terminal of the negative-side voltage comparison circuit V2 for limiting the potential difference between opposite ends of the negative-side voltage limiter to not higher than a predetermined value.

With this specific construction, the potential difference between the positive power line and the positive terminal of the positive-side voltage comparison circuit V1 is limited to not higher than a predetermined value, and the potential difference between the negative power line and the negative terminal of the negative-side voltage comparison circuit V2 is limited to not higher than a predetermined value. Accordingly, the positive-side comparison circuit V1 and the negative-side comparison circuit V2 to be used can be a circuit having a sensitivity region only in the voltage range of up to the predetermined value. This makes it possible for the comparison circuits to achieve improved voltage detection accuracy.

Thus, the leak detecting circuit of the invention for power source devices can detect leaks due to relatively low ground-fault resistances of tens of kΩ with high accuracy. Further even if the output voltage of the power source device varies, leaks due to a predetermined ground-fault resistance can be detected at a specified detection voltage.

DETAILED DESCRIPTION OF THE PREFERRED EMBODIMENT

Embodiments of the present invention will be described below in detail with reference to the drawings. The leak detecting circuit of the invention is adapted to detect leaks occurring in a line P and line N extending from a cell unit Vb which comprises about 200 nickel-hydrogen cells NiMH connected in series.

The line P and the line N are connected to each other by a P-side first voltage dividing resistor R1A, P-side second voltage dividing resistor R1B, N-side first voltage dividing resistor R2A and N-side second voltage dividing resistor R2B which are connected to one another in series. The cell voltage Vb is divided by these resistors. The midpoint between the two voltage dividing resistors R1A, R1B on the P-side and the two voltage dividing resistors R2A, R2B on the N-side is connected to ground (chassis). The line P and the line N are also connected to each other by a first auxiliary voltage dividing resistor R3, second auxiliary voltage dividing resistor R4 and third auxiliary voltage dividing resistor R5 which are connected to one another in series. The cell voltage Vb is divided by these resistors.

The midpoint between the first auxiliary voltage dividing resistor R3 and the second auxiliary voltage dividing resistor R4 and the midpoint between the P-side first voltage dividing resistor R1A and the P-side second voltage dividing resistor R1B are connected to each other by a P-side voltage comparison circuit V1. The midpoint between the second auxiliary voltage dividing resistor R4 and the third auxiliary voltage dividing resistor R5 and the midpoint between the N-side first voltage dividing resistor R2A and the N-side second voltage dividing resistor R2B are also connected to each other by an N-side voltage-comparison circuit V2. The P-side voltage comparison circuit V1 and the N-side voltage comparison circuit V2 each compare a positive-terminal potential and negative-terminal potential to produce a logic signal high when the positive-terminal potential is higher than the negative-terminal potential.

Furthermore, the line P and the positive terminal of the P-side voltage comparison circuit V1 are connected to each other by a P-side constant voltage diode D1 for the diode D1 to limit the potential difference between the line P and the positive terminal of the circuit V1 to not higher than a constant value (5 V). The line N and the negative terminal of the N-side voltage comparison circuit V2 are connected to each other by an N-side constant voltage diode D2 for the diode D2 to limit the potential difference between the line N and the negative terminal of the circuit V1 to not higher than a constant value (5 V).

Figure 2:
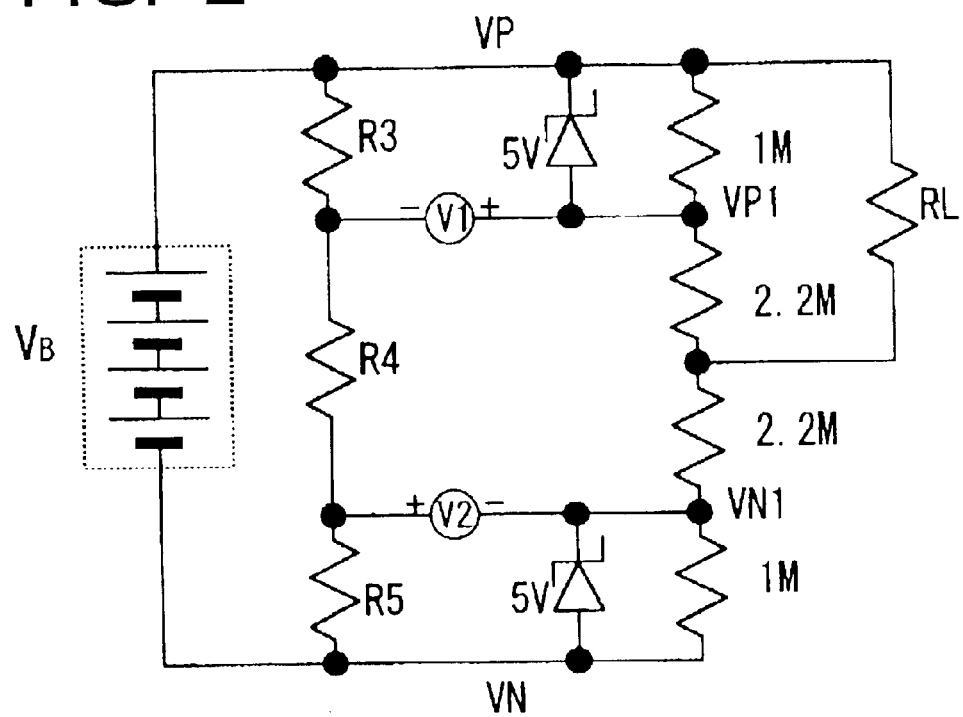
FIG. 2 is a diagram showing an equivalent circuit of the leak detecting circuit in the event of a leak occurring.

When a leak occurs, for example, in the line P of the leak detecting circuit of the invention described, the line P is grounded through a ground-fault resistance RL shown in FIG. 2, so that the illustrated equivalent circuit can be thought to be set up. As illustrated, suppose the P-side first voltage dividing resistor R1A and the N-side first voltage dividing resistor R2A are each 1 MΩ in resistance value, the P-side second voltage dividing resistor R1B and the N-side second voltage dividing resistor R2B are each 2.2 MΩ in resistance value, the constant voltage diodes D1, D2 are each 5 V in limiting voltage, and the cell voltage Vb is 240 V. Table 3 shows the difference of the potential VP1 of the midpoint between the P-side first voltage dividing resistor R1A and the P-side second voltage dividing resistor R1B from the potential VP of the line P, i.e., VP-VP1, and the difference of the potential VN1 of the midpoint between the N-side first voltage dividing resistor R2A and the N-side second voltage dividing resistor R2B from the potential VN of the line N, i.e., VN-VN1, when the ground-fault resistance RL then varies like 0 Ω, 50 kΩ, 70 kΩ, 1 MΩ, 2 MΩ and ∞.

TABLE 3

| Ground-fault resistance RL | 0 Ω | 50 kΩ | 70 kΩ | 1 MΩ | 2 MΩ | ∞ |
|---|---|---|---|---|---|---|
| Voltage difference VP–VP1 | 0 V | 1.63 V | 2.26 V | 5 V(*) | 5 V(*) | 5 V(*) |
| Voltage difference VN–VN1 | 5 V(*) | 5 V(*) | 5 V(*) | 5 V(*) | 5 V(*) | 5 V(*) |

The mark (*) in Table 3 indicates that the potential difference is limited to an upper limit value of 5 V by the function of the constant voltage diode D1 or D2.

Accordingly, the occurrence of a leak at a ground-fault resistance RL of up to 70 kΩ is detected from a voltage difference (VP-VP1) of below 2.26 V, and the occurrence of a leak at a ground-fault resistance RL of up to 50 kΩ is detected from a voltage difference (VP-VP1) of below 1.63 V. However, since the voltage difference (VP-VP1) varies not only with the resistance value of the ground-fault resistance RL but also with the magnitude of cell voltage Vb, there is a need to detect the occurrence of a leak by detecting a specified voltage when the leak results from a predetermined ground-fault resistance, despite variations in the cell voltage Vb.

Accordingly, with the leak detecting circuit of the present invention, the cell voltage Vb is divided by the first auxiliary voltage dividing resistor R3, second auxiliary voltage dividing resistor R4 and third auxiliary voltage dividing resistor R5, the potential of the midpoint between the first resistor R3 and the second resistor R4 is input to the negative terminal of the P-side voltage comparison circuit V1, and the potential of the midpoint between the second resistor R4 and the third resistor R5 to the positive terminal of the N-side voltage comparison circuit V2.

Figure 3:
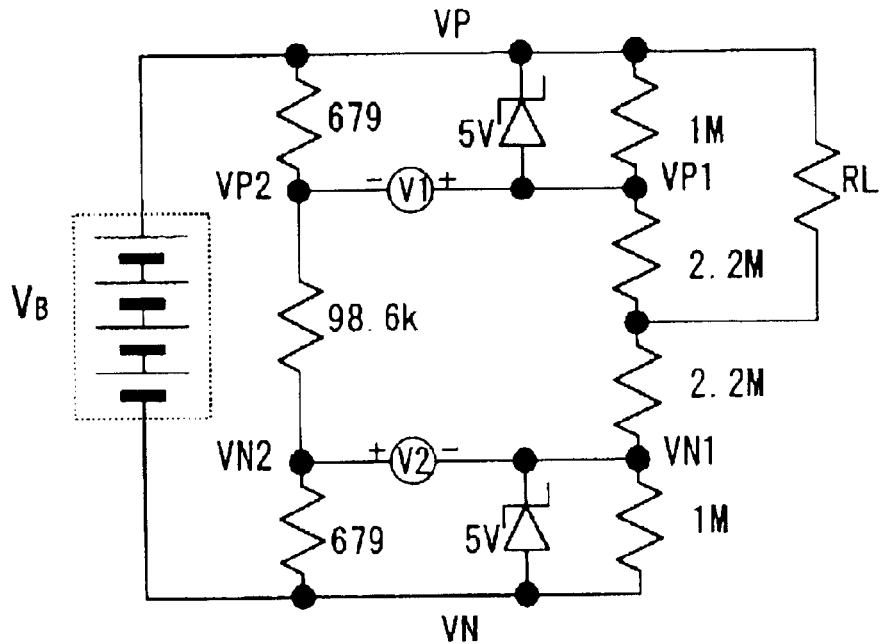
FIG. 3 is a diagram showing a design example of the leak detecting circuit.

The resistance values of the first auxiliary voltage dividing resistor R3, second auxiliary voltage dividing resistor R4 and third auxiliary voltage dividing resistor R5 in this arrangement are so determined that the potential at each midpoint is the potential difference to be detected. For example, to detect a leak occurring with a ground-fault resistance RL of 50 kΩ, the resistance values of the three resistors R3 to R5 are so determined that the potential at the midpoint between the first resistor R3 and the second resistor R4 differs from the potential of the line P by 1.63 V. When the ground-fault resistance RL is below 50 kΩ in the event of a leak occurring, the potential difference (VP-VP1) becomes smaller than 1.63 V, with the result that the output of the P-side voltage comparison circuit changes from low to high to detect the leak. FIG. 3 shows a design example of leak detecting circuit for detecting a leak occurring at a ground-fault resistance RL of 50 kΩ.

Figure 1:
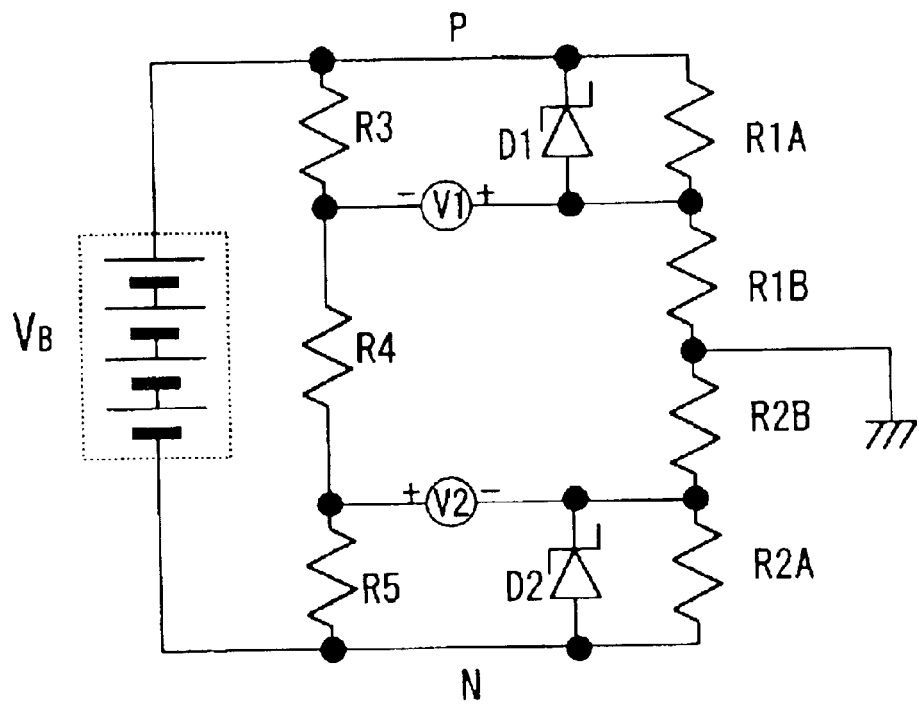
FIG. 1 is a diagram showing a leak detecting circuit of the invention for power source devices.

In the case of the leak detecting circuit of the invention described, i.e., in each of the circuit construction (FIG. 1) in the absence of leaks and the circuit construction (FIG. 2) when a leak occurs, the potential difference (VP-VP1) is determined by the combined resistance of the circuit and the cell voltage, and the reference voltage to be compared with the potential difference (VP-VP1) is also determined by the combined resistance of the circuit and the cell voltage. Thus, the reference voltage for comparison also varies in proportion to the cell voltage. Accordingly, even if the cell voltage varies, the influence of the variation on the comparison of voltages is offset, and the result of comparison is dependent only on variations in the combined resistance. As a result, the detection of leaks is realized based only on the magnitude of ground-fault resistance despite variations in the cell voltage.

With the leak detecting circuit of the invention, when the ground-fault resistance RL has a relatively low resistance value to be detected, i.e., a value of about 50 kΩ to about 70 kΩ, the potential difference (VP-VP1) occurs within the range of 0 to 5 V. If the ground-fault resistance RL has a high resistance value in excess of 1 MΩ, on the other hand, the potential difference (VP-VP1) is limited to the upper limit voltage (5 V) of the diode D1. Accordingly, 5 V is the upper limit for the input range of the voltage comparison circuits V1, V2, and there is no likelihood that a high voltage will be applied to the circuit. These comparison circuits are therefore simplified in construction. The circuits V1, V2 which are thus low in maximum input range achieve higher accuracy than voltage comparison circuits which are, for example, as high as 100 V in maximum input range.

Figure 6:
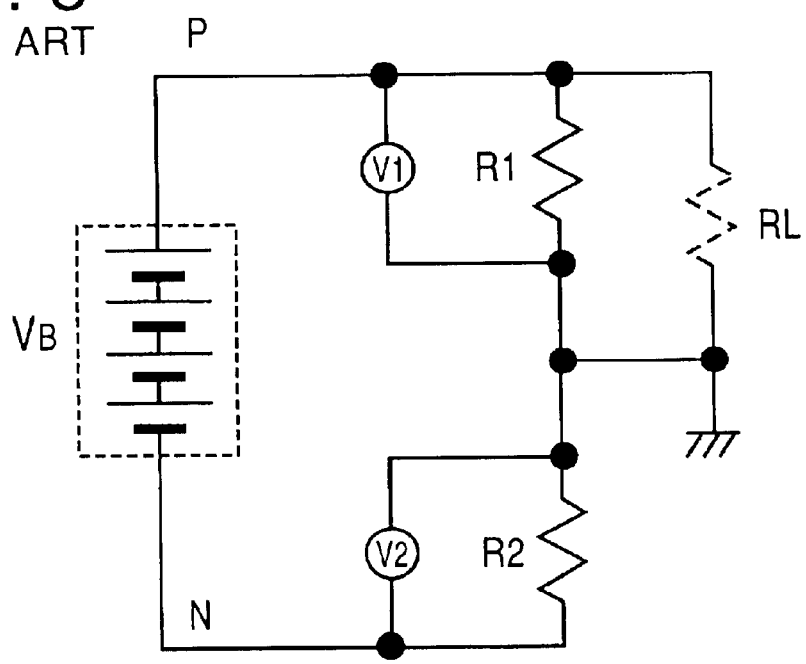
FIG. 6 is a diagram showing another conventional leak detecting circuit.
Figure 7:
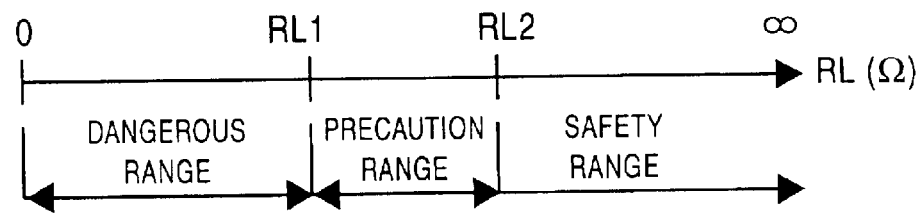
FIG. 7 is a diagram for illustrating the idea of judging leaks detected.
Figure 8:
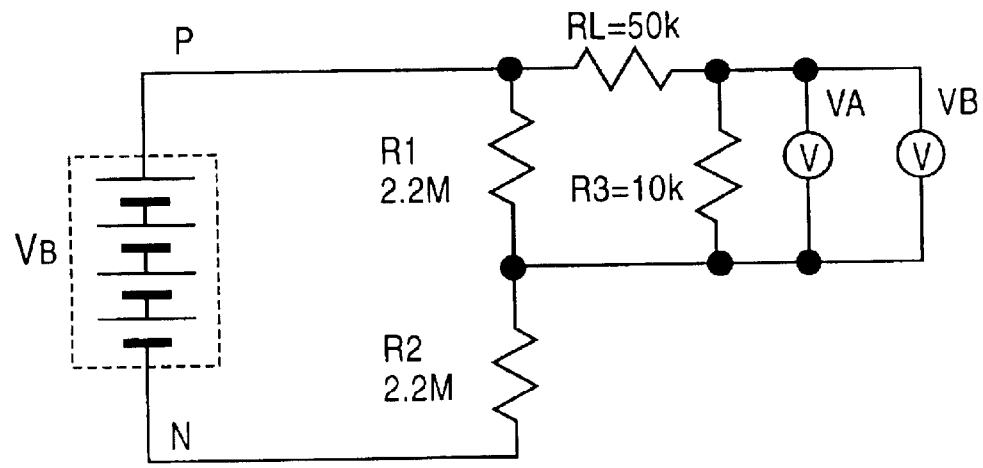
FIG. 8 is a diagram showing a design example of leak detecting circuit of FIG. 5.
Figure 9:
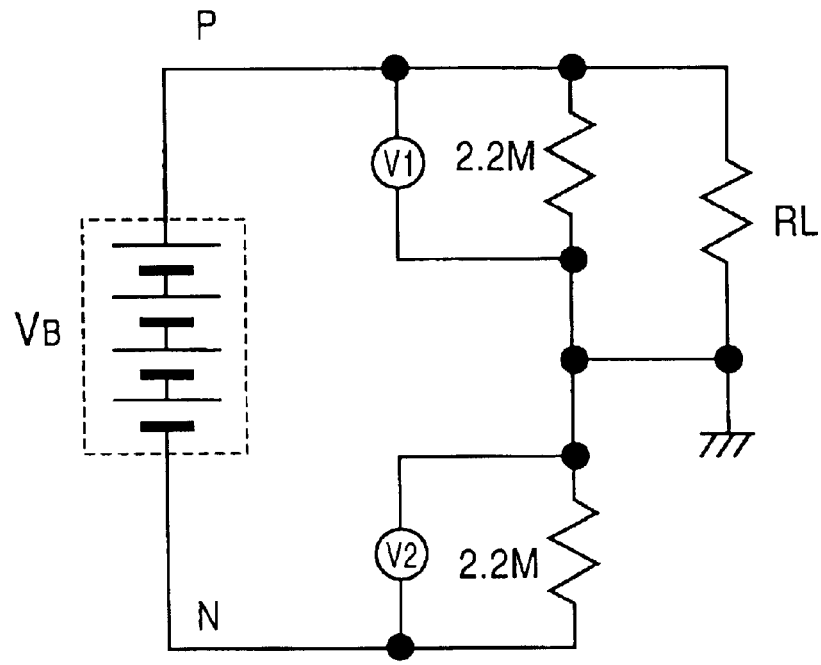
FIG. 9 is a diagram showing a design example of leak detecting circuit of FIG. 6.
Figure 10:
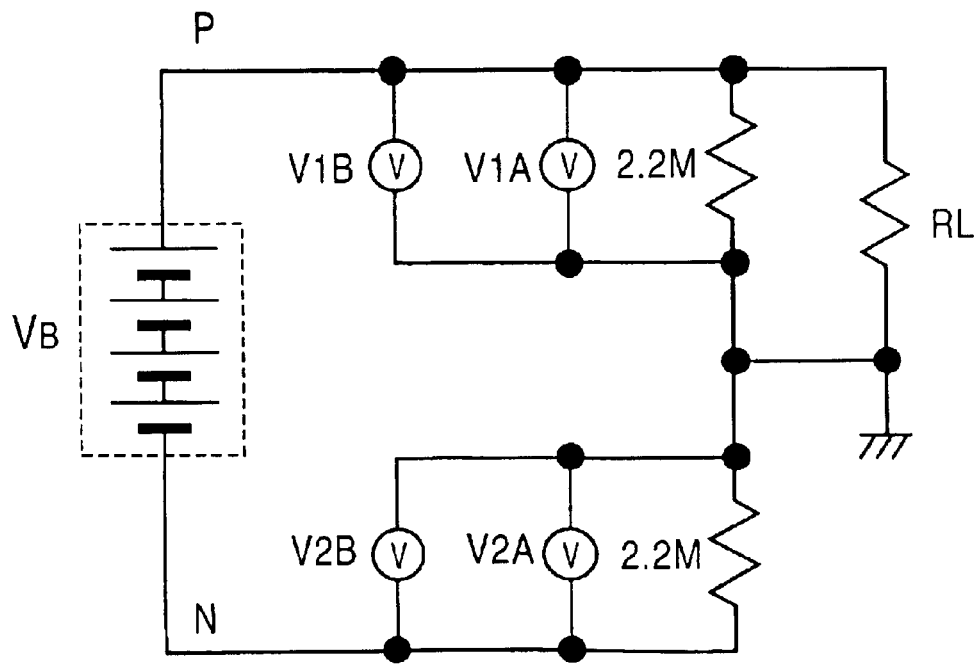
FIG. 10 is a diagram showing another conventional leak detecting circuit.

For example in the conventional leak detecting circuits shown in FIGS. 6 and 9, 120 V is steadily applied to voltmeters V1, V2, and the voltage occurring on each resistor is 234.6 V when the ground-fault resistance RL is 50 kΩ, or 232.6 V when the ground-fault resistance RL is 70 kΩ. Thus, the difference between the resistances 50 kΩ and 70 kΩ is merely 2 V in voltage judgement value. It is therefore difficult to accurately judge the voltage of 2 V relative to the input voltage of about 230 V.

Figure 4:
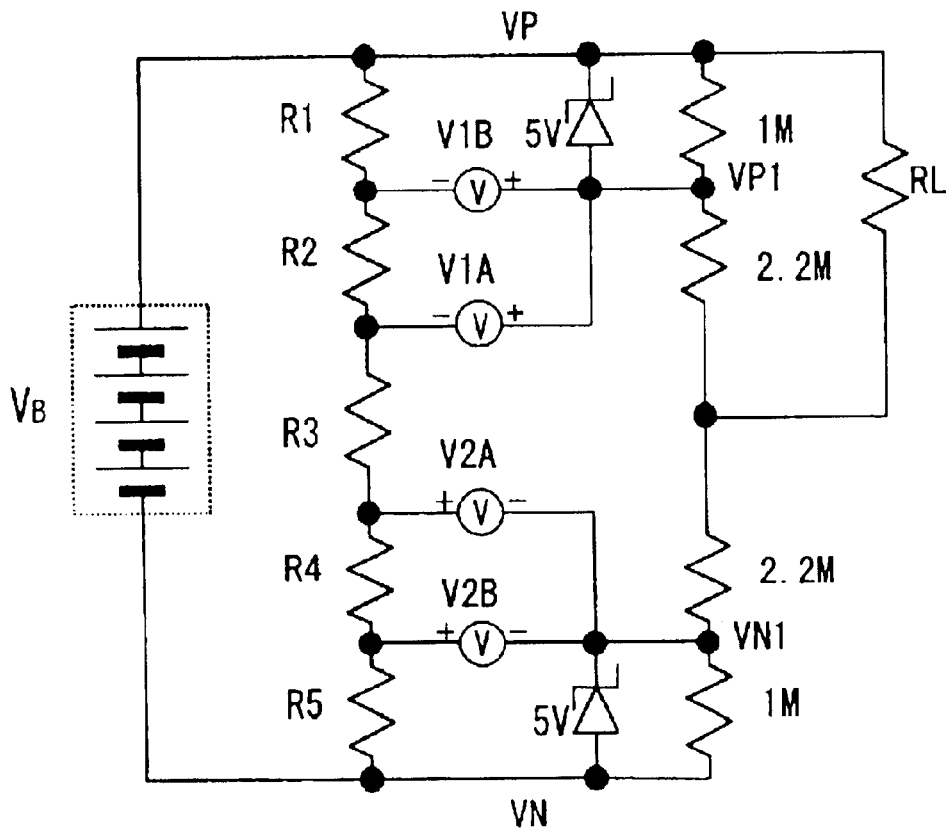
FIG. 4 is a diagram showing another leak detecting circuit of the invention.
Figure 5:
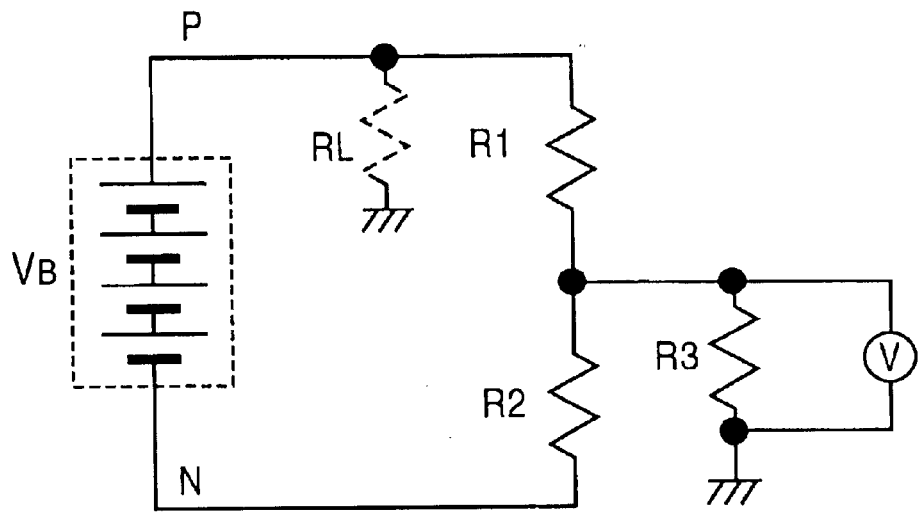
FIG. 5 is a diagram showing a conventional leak detecting circuit.

FIG. 4 shows the construction of a leak detecting circuit for detecting leaks individually when the ground-fault resistance is 50 kΩ and when the resistance is 70 kΩ. With reference to the circuit, a line P and a line N are connected to each other by a first auxiliary voltage dividing resistor R1, second auxiliary voltage dividing resistor R2, third auxiliary voltage dividing resistor R3, fourth auxiliary voltage dividing resistor R4 and fifth auxiliary voltage dividing resistor R5 which are connected to one another in series. The negative terminal of a P-side first voltage comparison circuit V1A is connected to the midpoint between the second auxiliary voltage dividing resistor R2 and the third auxiliary voltage dividing resistor R3, and the negative terminal of a P-side second voltage comparison circuit V1B is connected to the midpoint between the first auxiliary voltage dividing resistor R1 and the second auxiliary voltage dividing resistor R2. The positive terminal of an N-side first voltage comparison circuit V2A is connected to the midpoint between the third auxiliary voltage dividing resistor R3 and the fourth auxiliary voltage dividing resistor R4, and the positive terminal of an N-side second voltage comparison circuit V2B is connected to the midpoint between the fourth auxiliary voltage dividing resistor R4 and the fifth auxiliary voltage dividing resistor R5.

The P-side first voltage comparison circuit V1A and the N-side first voltage comparison circuit V2A are each adapted to detect leaks with a ground-fault resistor RL of up to 70 kΩ. The P-side second voltage comparison circuit V1B and the N-side second voltage comparison circuit V2B are each adapted to detect leaks due to a ground-fault resistor RL of up to 50 kΩ. The voltage values of the first to fifth auxiliary voltage dividing resistors R1, R2, R3, R4, R5 are so determined that the voltage values divided by these resistors provide points for detecting leaks due to ground-fault resistances of 50 kΩ and 70 kΩ.

Stated more specifically, the divided voltage values of R1-R2-R3-R4-R5 are so determined that the potential difference between the line P and the negative terminal of the P-side second voltage comparison circuit V1B will be 1.63 V, that the potential difference between the line P and the negative terminal of the P-side first voltage comparison circuit V1A will be 2.26 V, that the potential difference between the line N and the negative terminal of the N-side second voltage comparison circuit V2B will be −1.63 V, that the potential difference between the line N and the negative terminal of the N-side first voltage comparison circuit V2A will be −2.26 V.

The leak detecting circuit of FIG. 4 is adapted to accurately detect leaks due to a ground-fault resistance of 50 kΩ and leaks due to a ground-fault resistance of 70 kΩ.

I claim:

1. A leak detecting circuit for a power source device having a cell unit comprising a plurality of cells connected in series, wherein a pair of positive and negative power lines extending from respective opposite electrodes of the cell unit are connected to each other by four voltage dividing resistors (R1A, R1B, R2A, R2B) connected to one another in series, a midpoint between the two voltage dividing resistors (R1A, R1B) arranged on the positive power line side and the two voltage dividing resistors (R2A, R2B) arranged on the negative power line side being grounded, and the potential difference between the positive power line and the midpoint between the two voltage dividing resistors (R1A, R1B) on the positive side and the potential difference between the negative power line and the midpoint between the two voltage dividing resistors (R2A, R2B) on the negative side are compared with respective reference voltages to detect a leak.

2. A leak detecting circuit according to claim 1 wherein the reference voltage on the positive side is set at a potential difference to be produced between the positive power line and the midpoint between the two voltage dividing resistors (R1A, R1B) on the positive side when a leak occurs due to a ground-fault resistance value to be detected, and the reference voltage on the negative side is set at a potential difference to be produced between the negative power line and the midpoint between the two voltage dividing resistors (R2A, R2B) on the negative side when a leak occurs due to a ground-fault resistance value to be detected.

3. A leak detecting circuit according to claim 1 or 2 wherein the pair of positive and negative power lines extending from the respective opposite electrodes of the cell unit are connected to each other by at least three auxiliary voltage dividing resistors (R3, R4, R5) connected to one another in series, and at least two potential reference points are provided between the auxiliary voltage dividing resistors, a positive-side voltage comparison circuit (V1) being interposed between one of the potential reference points and the midpoint between the two voltage dividing resistors (R1A, R1B) on the positive side, a negative-side voltage comparison circuit (V2) being interposed between the other potential reference point and the midpoint between the two voltage dividing resistors (R2A, R2B) on the negative side.

4. A leak detecting circuit according to claim 3 wherein the positive-side voltage comparison circuit (V1) and the negative-side voltage comparison circuit (V2) each have a sensitivity region in the vicinity of the voltage to be detected and corresponding to a ground-fault voltage value to be judged as producing the leak.

5. A leak detecting circuit according to claim 3 wherein a positive-side voltage limiter is interposed between the positive power line and a positive terminal of the positive-side voltage comparison circuit (V1) for limiting the potential difference between opposite ends of the voltage limiter to not higher than a predetermined value, and a negative-side voltage limiter is interposed between the negative power line and a negative terminal of the negative-side voltage comparison circuit (V2) for limiting the potential difference between opposite ends of the negative-side voltage limiter to not higher than a predetermined value.

* * * * *